United States Patent
Kunii

(10) Patent No.: US 8,134,420 B2
(45) Date of Patent: Mar. 13, 2012

(54) COMMUNICATION APPARATUS AND SIGNAL PROCESSING METHOD THEREOF

(75) Inventor: Tadahiro Kunii, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 179 days.

(21) Appl. No.: 12/723,081

(22) Filed: Mar. 12, 2010

(65) Prior Publication Data
US 2010/0244975 A1    Sep. 30, 2010

(30) Foreign Application Priority Data

Mar. 30, 2009  (JP) ................................ 2009-082937

(51) Int. Cl.
- H03K 7/08 (2006.01)
- H03K 3/017 (2006.01)
- H03F 3/217 (2006.01)
- H03G 3/20 (2006.01)
- H04B 1/69 (2006.01)

(52) U.S. Cl. .......... 332/109; 332/117; 327/36; 327/175; 330/251; 375/130; 375/238; 381/107

(58) Field of Classification Search .............. 332/109, 332/110, 112, 117; 327/31, 36, 164, 172–175; 330/10, 251; 375/130, 132, 138, 238, 239; 381/94.1, 104, 106–108
See application file for complete search history.

(56) References Cited

U.S. PATENT DOCUMENTS

| | | | |
|---|---|---|---|
| 4,616,271 A | * | 10/1986 | Yasukawa et al. .............. 360/32 |
| 4,882,664 A | * | 11/1989 | Pennington ...................... 363/41 |
| 4,952,884 A | | 8/1990 | Tokumo et al. |
| 5,150,415 A | * | 9/1992 | Jaffee et al. .................... 381/104 |
| 5,994,973 A | * | 11/1999 | Toki ............................... 332/109 |
| 6,240,191 B1 | * | 5/2001 | Yoon ............................. 381/109 |
| 7,049,885 B2 | * | 5/2006 | Ishizaki ......................... 330/10 |

FOREIGN PATENT DOCUMENTS

JP    S57-206109 A    12/1982

(Continued)

OTHER PUBLICATIONS

Japan Patent Office, Notification of Reason for Refusal for Japanese Patent Application No. 2010-067669 (counterpart to above-captioned patent application), dispatched Jun. 21, 2011.

*Primary Examiner* — Levi Gannon
(74) *Attorney, Agent, or Firm* — Baker Botts L.L.P.

(57) ABSTRACT

A communication apparatus including: a modulator which modulates a reference clock signal having a predetermined basic frequency and outputs a modulated clock signal whose value fluctuates at a first frequency with respect to the basic frequency; a PWM signal generator which generates a PWM signal at a second frequency, with the modulated clock signal being as an operation clock; a switching portion which outputs a signal by switching an analog signal on the basis of the PWM signal; a filter which passes a signal included in an output signal of the switching portion, a frequency of the passed signal being lower than a third frequency, and a setting portion which sets the first frequency and the second frequency such that a fourth frequency in which a duty value of the PWM signal fluctuates is higher than the third frequency and such that the first frequency is higher than the second frequency.

13 Claims, 4 Drawing Sheets

FOREIGN PATENT DOCUMENTS

| | | |
|---|---|---|
| JP | S60-114040 A | 6/1985 |
| JP | H02-058705 A | 2/1990 |
| JP | H02-177606 A | 7/1990 |
| JP | 2003-324944 A | 11/2003 |
| JP | 2006-167983 A | 6/2006 |
| JP | 2006-340333 A | 12/2006 |
| JP | 2007-008072 A | 1/2007 |
| JP | 2007-026082 A | 2/2007 |

* cited by examiner

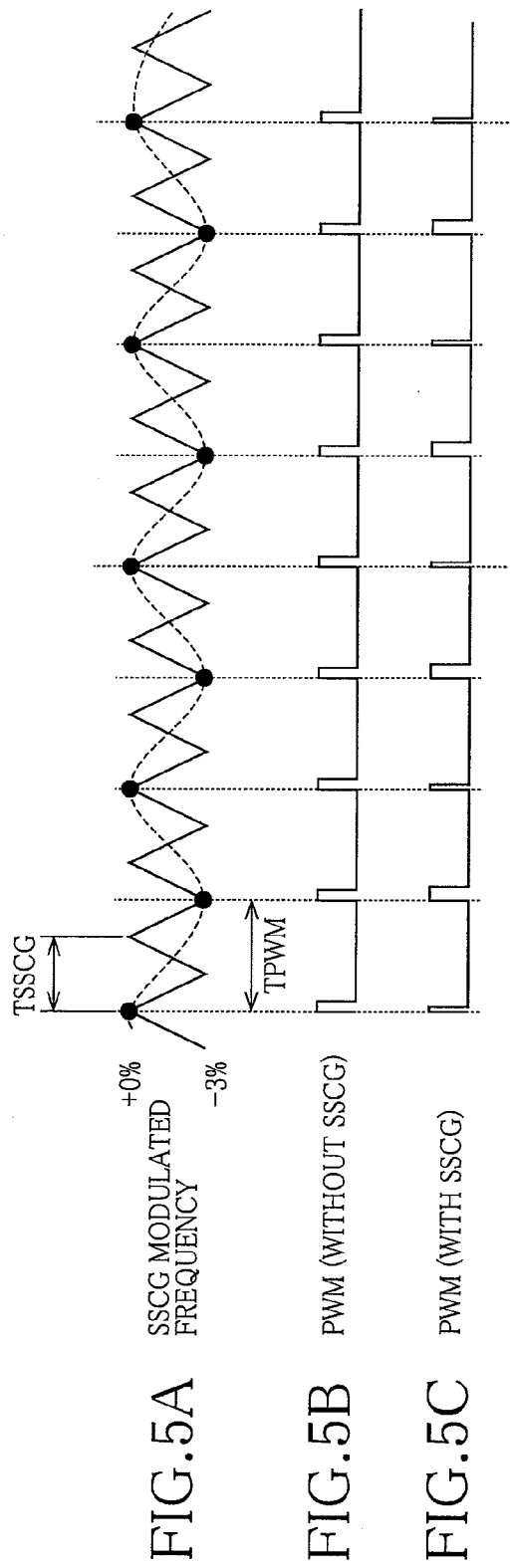

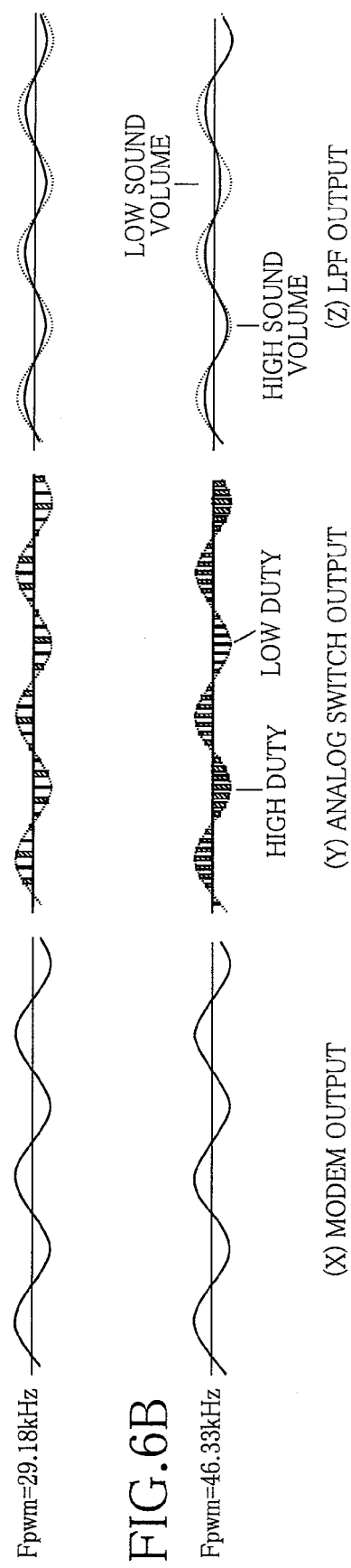

COMMUNICATION APPARATUS AND SIGNAL PROCESSING METHOD THEREOF

CROSS REFERENCE TO RELATED APPLICATION

The present application claims priority from Japanese Patent Application No. 2009-082937, which was filed on Mar. 30, 2009, the disclosure of which is herein incorporated by reference in its entirety.

BACKGROUND OF THE INVENTION

1. Field of the Invention

The present invention relates to a communication apparatus, in particular a communication apparatus including a spread spectrum clock generator and a PWM circuit, and to a signal processing method of the communication apparatus.

2. Description of the Related Art

There has been recently increased cases of employing a spread spectrum clock generator (hereinafter may be abbreviated as "SSCG") as a measure against Electromagnetic Interference (EMI).

The SSCG lowers a peak value of a frequency spectrum of a clock signal by slightly changing a frequency of the clock signal (i.e., a basic frequency). Thus, a radiation noise can be reduced by employing the SSCG.

Conventionally, various controls are executed using a Pulse Width Modulation (PWM) circuit. The PWM circuit controls a ratio of time lengths of On- and Off-states of, e.g., a switch by changing a duty (i.e., a duty ratio) of a pulse wave in a predetermined cycle. The PWM circuit produces the pulse wave on the basis of a modulated clock signal in which the frequency is modulated.

SUMMARY OF THE INVENTION

Inventors of the present application have conceived that a modulated frequency of the modulated clock signal (i.e., an SSCG frequency that is a frequency calculated from a cycle of the fluctuation of a frequency of the modulated clock signal) is made higher than the conventional one in order to achieve greater functionality of a circuit which is different from the PWM circuit. In this case, the inventors have tested that only the SSCG frequency is made higher without changing the PWM frequency of the PWM circuit (i.e., a frequency at which a pulse signal is generated). As a result, the inventors have found that a duty of a pulse wave outputted by the PWM circuit is fluctuated from a set value (a constant value) and periodically enlarged and reduced, generating a variation of the PWM signal that is a phenomenon in which a duty value varies or changes periodically, and thus found that there is a case where the variation of the PWM signal arises problems. For example, in the case where a volume adjustment is performed by using the On- and Off-states of the switch by the PWM signal, when the varying frequency of the PWM signal falls within an audible range of humans, an unpleasant sound is generated by change of a sound volume due to the variation of the PWM signal. Consequently, the inventors have found that values of the PWM frequency and the SSCG frequency need to be set by considering a relationship between the PWM frequency and the SSCG frequency in order to avoid these problems.

This invention has been developed in view of the above-described situations, and it is an object of the present invention to provide a communication apparatus and a signal processing method thereof which can reduce an adverse effect caused by a PWM signal of a variation where a modulated clock signal is used for an operation clock of a PWM circuit.

The object indicated above may be achieved according to the present invention which provides a communication apparatus comprising: a modulator configured to modulate a reference clock signal having a predetermined basic frequency and output a modulated clock signal whose value fluctuates at a first frequency with respect to the basic frequency; a PWM signal generator configured to generate a PWM signal at a second frequency, with the modulated clock signal being as an operation clock;

a switching portion configured to output a signal by switching an analog signal on the basis of the PWM signal; a filter configured to pass a signal included in an output signal of the switching portion, a frequency of the passed signal being lower than a third frequency, and a setting portion configured to set the first frequency and the second frequency such that a fourth frequency as a frequency in which a duty value of the PWM signal generated by the PWM signal generator fluctuates is higher than the third frequency and such that the first frequency is higher than the second frequency.

The object indicated above may also be achieved according to the present invention which provides a signal processing method comprising: modulating a reference clock signal having a predetermined basic frequency and outputting a modulated clock signal whose value fluctuates at a first frequency with respect to the basic frequency; generating a PWM signal at a second frequency, with the modulated clock signal being as an operation clock; outputting a signal by switching an analog signal on the basis of the PWM signal; passing a signal whose frequency is lower than a third frequency component included in an output signal of the switching portion; and setting the first frequency and the second frequency such that a fourth frequency as a varying frequency of the PWM signal which is generated by the PWM signal generator is higher than the third frequency and such that the first frequency is higher than the second frequency.

BRIEF DESCRIPTION OF THE DRAWINGS

The objects, features, advantages, and technical and industrial significance of the present invention will be better understood by reading the following detailed description of an embodiment of the invention, when considered in connection with the accompanying drawings, in which:

FIGS. 5A, 5B, and 5C are views each showing a relationship between an SSCG modulated frequency and the PWM signal; and FIGS. 6A and 6B are views showing, by comparing, a voice outputting signal by the PWM signal of the communication apparatus in the present embodiment and a voice outputting signal by a PWM signal in which the varying frequency of the PWM signal is close to a frequency of a voice signal.

DESCRIPTION OF THE EMBODIMENT

Figure 1:
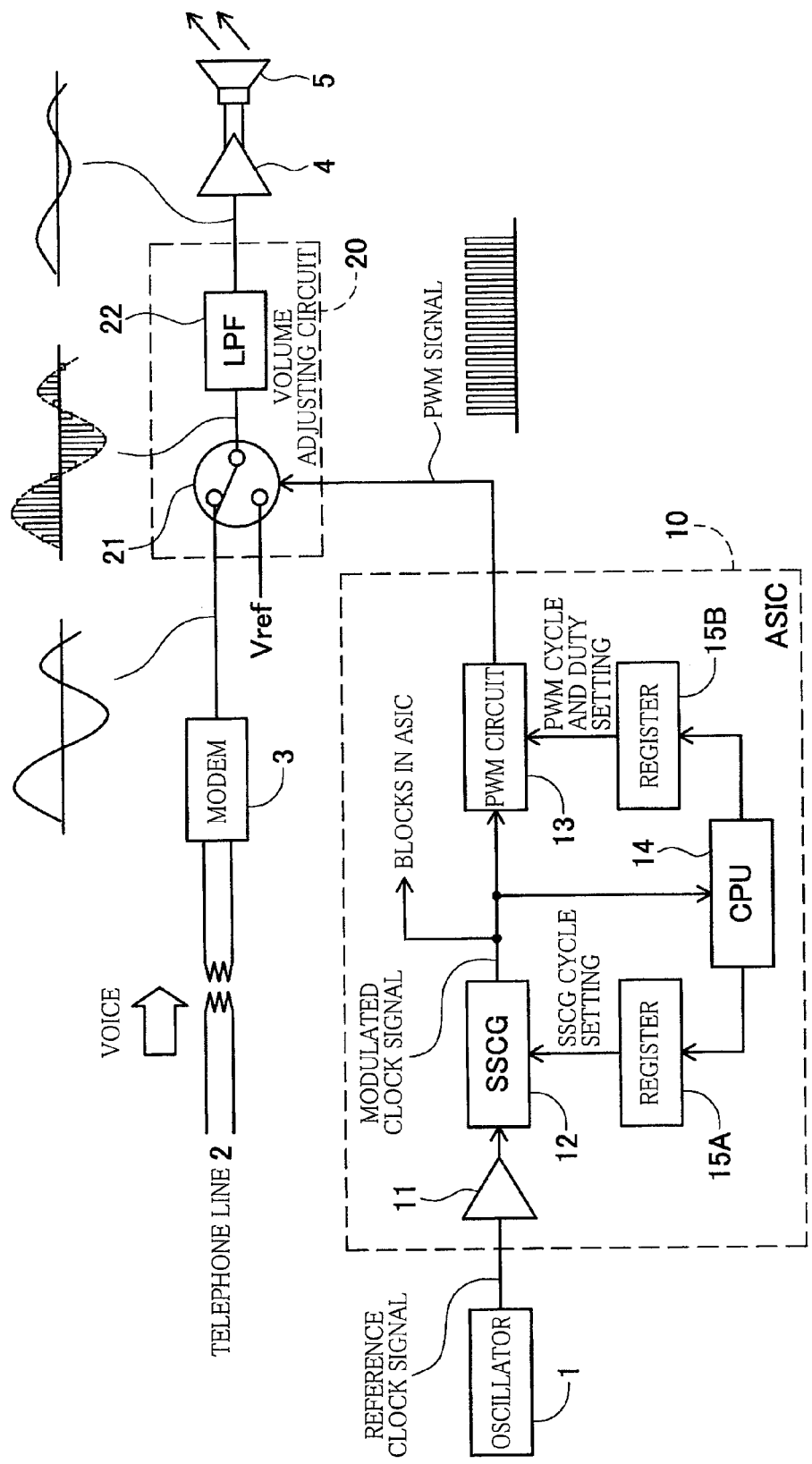
FIG. 1 is a block diagram showing a configuration of a communication apparatus.

Hereinafter, there will be described a communication apparatus as an embodiment of the present invention by reference to the drawings.

A reference clock signal outputted by a clock oscillator 1 is inputted into a spread spectrum clock generator (SSCG) 12 via a clock driver 11 in an ASIC 10. The SSCG 12 modulates as a modulator the reference clock signal and outputs a modulated clock signal in which a frequency fluctuates in an SSCG cycle "Tsscg" with respect to a basic frequency of the reference clock signal. The modulated clock signal outputted by the SSCG 12 is supplied to a PWM circuit 13, a CPU 14, and blocks in the ASIC 10.

The PWM circuit 13 outputs as a PWM signal generator the PWM signal to an analog switch 21 in a volume adjusting circuit 20, with the modulated clock signal being as an operation clock. The CPU 14 sets the SSCG cycle "Tsscg" to the SSCG 12 by writing into a register 15A. The CPU 14 may set an SSCG frequency "Fsscg" to the SSCG 12 by writing into the register 15A. Further, the CPU 14 sets as a setting portion a PWM cycle "Tpwm" and a duty of the PWM signal to the PWM circuit 13 by writing into a register 15B. The CPU 14 may set a PWM frequency "Fpwm" to the PWM circuit 13 by writing into the register 15B. It is noted that each of 1/Tsscg and 1/Tpwm is set in advance at a frequency higher than that of an analog signal for an volume adjustment.

The analog switch 21 as a switching portion is switched between a reference potential Vref and a voice signal inputted from a telephone line 2 and received by a modem 3. As a result, as shown in FIG. 1, a signal changed between the reference potential Vref and a potential of a signal outputted by the modem 3 is outputted from the analog switch 21. A low pass filter (LPF) 22 allows only a frequency component lower than a predetermined frequency as a third frequency to pass among signals outputted from the analog switch 21, and reduces and interrupts a high frequency component higher than the predetermined threshold. As a result, as shown in FIG. 1, a signal changing smoothly is outputted from the LPF 22. The voice signal processed by the analog switch 21 and the LPF 22 is outputted from a speaker 5 via a speaker amplifier 4.

The analog switch 21 performs the switching on the basis of the PWM signal, and thus the volume adjustment of the voice signal inputted from the telephone line 2 can be performed by changing the duty of the PWM signal. Specifically, a sound volume can be made larger where the duty of the PWM signal is made larger while the sound volume can be made smaller where the duty is made smaller.

There will be explained a setting of the SSCG frequency "Fsscg" (the SSCG cycle "Tsscg") as a first frequency and the PWM frequency "Fpwm" (the PWM cycle "Tpwm") as a second frequency in the communication apparatus constructed as described above as an embodiment of the present invention. FIGS. 5A, 5B, and 5C are views showing a change of a duty of a pulse wave of the PWM signal with respect to a fluctuation of the frequency of the modulated clock signal outputted by the SSCG 12. FIG. 5A is a graph showing the fluctuation of the frequency of the modulated clock signal outputted by the SSCG 12. A vertical axis of this graph represents the frequency. A position at which the frequency is 0% represents the case where the frequency of the modulated clock signal is the basic frequency (that is, a fluctuating degree is 0%) while a position at which the frequency is −3% represents a lower limit of the frequency of the modulated clock signal where the frequency is fluctuated and lowered (that is, the fluctuating degree is −3%). As shown in FIG. 5A, the frequency of the modulated clock signal is periodically fluctuated, and where the frequency of the fluctuation of the frequency value of the modulated clock signal is the SSCG modulated frequency, the Tsscg shown in FIG. 5A represents one cycle of the fluctuation of the frequency value of the modulated clock signal. Each of the Tsscg and the Fsscg is a value set by writing of the CPU 14 into the register 15A. FIG. 5B is a graph showing an example of the PWM signal outputted by the PWM circuit 13. Here, FIG. 5B shows, as a reference example, the PWM signal outputted by the PWM circuit 13 where the frequency of the operation clock signal does not fluctuate. A vertical axis of this graph is a voltage value, a cycle of the PWM signal is the PWM cycle (i.e., the Tpwm), and the frequency of the PWM signal is the Fpwm. Each of the Tpwm and the Fpwm is a value set by writing of the CPU 14 into the register 15B. Further, FIG. 5C is a graph showing the PWM signal outputted by the PWM circuit 13 which is a PWM signal in the present embodiment. Further, each symbol "•" in FIG. 5A represents a point at which the PWM cycle "Tpwm" is plotted on the fluctuation of the SSCG frequency.

As shown in FIG. 5C, where the modulated clock signal by the SSCG 12 is used for the operation clock signal of the PWM circuit, the duty of the PWM signal is changed with respect to an original duty shown in FIG. 5B. This is because, as shown in the symbols "•" in FIG. 5A, phases of the fluctuation of the SSCG modulated frequency with respect to the PWM cycle "Tpwm" vary according to time t.

The PWM circuit 13 uses the modulated clock signal by the SSCG 12 for the operation clock. Thus, where the SSCG cycle "Tsscg" and the PWM cycle "Tpwm" are close to each other, the duty is periodically enlarged and reduced according to a difference between the SSCG cycle "Tsscg" and the PWM cycle "Tpwm", thereby causing a variation of the PWM signal that is a phenomenon in which a duty value varies or changes periodically. Further, where the PWM cycle "Tpwm" is close to twice, three times, four times, etc., of the SSCG cycle "Tsscg", the duty is periodically enlarged and reduced according to a difference between the PWM cycle "Tpwm" and twice, three times, four times, etc., of the SSCG cycle "Tsscg", thereby causing the variation of the PWM signal. In the case where this PWM signal is used for an adjustment of the sound volume of the voice signal outputted from the modem 3 in FIG. 1, when a varying frequency "Fmod" (a fourth frequency) of a duty value of the PWM signal falls within a range of the frequency of the voice signal (in other words, the varying frequency becomes equal to or lower than about 4 kHz), the sound volume is changed with the variation of the PWM signal, so that an unpleasant sound is made. Thus, in order to solve this problem, the communication apparatus as the present embodiment sets the SSCG frequency "Fsscg" and the PWM frequency "Fpwm" such that the varying frequency "Fmod" of the duty value of the PWM signal is not within the range of the frequency of the voice signal, that is, the varying frequency of the PWM signal becomes a predetermined frequency of equal to or higher than 4 kHz, and a manner of the setting will be explained below. It is noted that the varying frequency "Fmod" of the duty value of the PWM signal is preferably set at a frequency equal to or higher than about 10 kHz. Where the varying frequency "Fmod" of the duty value of the PWM signal is set at a frequency equal to or higher than about 10 kHz, the LPF 22 does not need to be an expensive filter, and thus the communication apparatus can be constructed at a lower cost.

Figure 2:
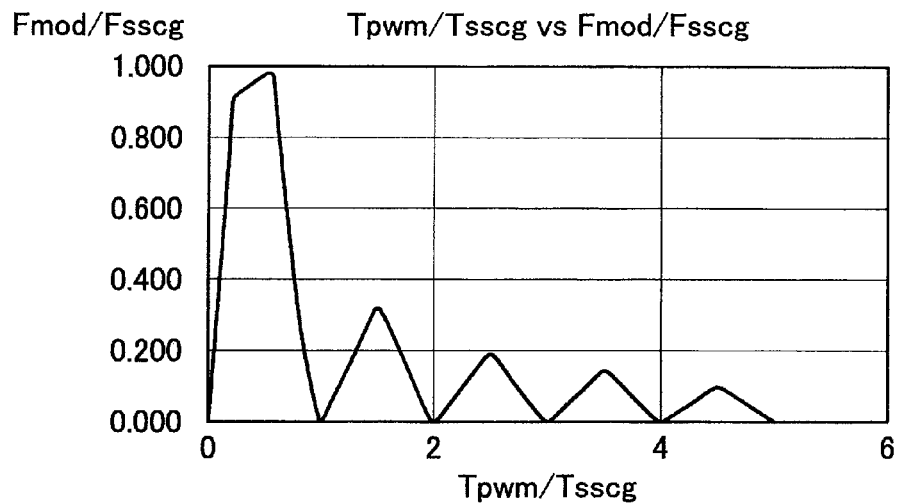
FIG. 2 is a view showing a relationship between (a) a ratio between a PWM cycle and an SSCG cycle and (b) a varying frequency of a PWM signal.

FIG. 2 is a view showing a relationship between (a) a ratio "Tpwm/Tsscg" of the PWM cycle "Tpwm" to the SSCG cycle "Tsscg" and (b) a value obtained by normalizing the varying frequency "Fmod" of the duty value of the PWM signal by the SSCG frequency "Fsscg", with the ratio "Tpwm/Tsscg" on a horizontal axis and the value on a vertical axis. Here, the SSCG frequency "Fsscg" is 1/Tsscg (the SSCG frequency "Fsscg"=1/Tsscg).

As shown in FIG. 2, the varying frequency "Fmod" of the duty value of the PWM signal becomes high when the ratio "Tpwm/Tsscg" of the PWM cycle "Tpwm" to the SSCG cycle "Tsscg" is larger than 0.1 and smaller than 0.6 (0.1<Tpwm/Tsscg<0.6). Where the varying frequency "Fmod" of the duty value of the PWM signal is relatively high, components of the varying frequency "Fmod" can be separated from the voice signal by the LPF 22. Thus, the CPU 14 sets the SSCG cycle "Tsscg" and the PWM cycle "Tpwm" such that the ratio "Tpwm/Tsscg" of the PWM cycle "Tpwm" to the SSCG cycle "Tsscg" becomes larger than 0.1 and smaller than 0.6 (0.1<Tpwm/Tsscg<0.6). As a reference example, there will be explained a case where the SSCG frequency "Fsscg" is set at 11 kHz (the SSCG frequency "Fsscg"=11 kHz), that is, the SSCG cycle "Tsscg" is set at $\frac{1}{11}$ ms (the SSCG cycle "Tsscg"=$\frac{1}{11}$ ms).

Reference Example

The Case of Fsscg=11 kHz (Tsscg=$\frac{1}{11}$ ms)

Figure 3:
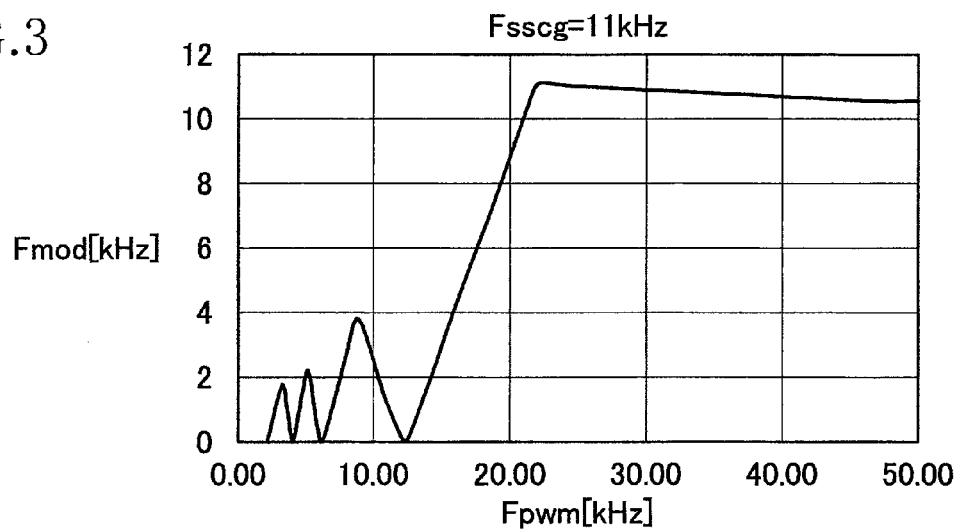
FIG. 3 is a view showing a relationship between a PWM frequency and the varying frequency of the PWM signal in the case where a frequency of an SSCG (Fsscg) is 11 kHz.

FIG. 3 is a view showing a relationship between the PWM frequency "Fpwm" and the varying frequency "Fmod" of the duty value of the PWM signal in the case where the SSCG frequency "Fsscg" is set at 11 kHz (the SSCG frequency "Fsscg"=11 kHz). Here, the PWM frequency "Fpwm" is 1/Tpwm (the PWM frequency "Fpwm"=1/Tpwm).

As described above, the CPU 14 sets the SSCG cycle "Tsscg" and the PWM cycle "Tpwm" such that the ratio "Tpwm/Tsscg" of the PWM cycle "Tpwm" to the SSCG cycle "Tsscg" becomes larger than 0.1 and smaller than 0.6 (0.1<Tpwm/Tsscg<0.6). Since the "Tpwm/Tsscg" is equal to "Fsscg/Fpwm" (Tpwm/Tsscg=Fsscg/Fpwm), in the case where the SSCG frequency "Fsscg" is 11 kHz, "11/Fpwm" only needs to become larger than 0.1 and smaller than 0.6 (0.1<11/Fpwm<0.6). Thus, the CPU 14 sets the PWM frequency "Fpwm" at 22 kHz (the PWM frequency "Fpwm"=22 kHz), that is, the CPU 14 sets the PWM cycle "Tpwm" at $\frac{1}{22}$ ms (the PWM cycle "Tpwm"=$\frac{1}{22}$ ms), for example.

As shown in FIG. 3, when the PWM frequency "Fpwm" is at 22 kHz (the PWM frequency "Fpwm"=22 kHz), the varying frequency "Fmod" of the duty value of the PWM signal is about 11 kHz. Since the voice signal used by, e.g., a telephone machine is up to about 3.4 kHz, where the varying frequency "Fmod" is about 11 kHz, the components of the varying frequency "Fmod" can be separated from the voice signal by the LPF 22. However, since the SSCG frequency is relatively low (Fsscg=11 kHz) in the above-described reference example, there will be explained an embodiment as an example of the embodiment of the present invention.

In general, the PWM frequency "Fpwm" can be set within a range of about 10 kHz to about 100 kHz. Further, a range of 10 kHz to 100 kHz is generally used in the SSCG frequency "Fsscg". In particular, the SSCG frequency "Fsscg" recently tends to be higher because of an increasing speed of the SSCG 12. For example, where the SSCG frequency "Fsscg" is 88 kHz (the SSCG frequency "Fsscg"=88 kHz), the PWM frequency "Fpwm" needs to be higher than 146.67 kHz and lower than 880 kHz (146.67 kHz<Fpwm<880 kHz) in order that the ratio "Tpwm/Tsscg" of the PWM cycle "Tpwm" to the SSCG cycle "Tsscg" becomes larger than 0.1 and smaller than 0.6 (0.1<Tpwm/Tsscg<0.6) like the above-described example. As a result, the PWM frequency "Fpwm" falls outside the range of 10 kHz to 100 kHz which is generally allowed to be set in the PWM frequency "Fpwm".

Embodiment of the Present Invention

As thus described, it becomes difficult to set the ratio "Tpwm/Tsscg" to be larger than 0.1 and smaller than 0.6 (0.1<Tpwm/Tsscg<0.6) because of the increasing speed of the SSCG 12. In contrast, in the communication apparatus as the embodiment of the present invention, where the ratio "Tpwm/Tsscg" cannot be set to be larger than 0.1 and smaller than 0.6, the CPU 14 sets the SSCG cycle "Tsscg" and the PWM cycle "Tpwm" such that the ratio "Tpwm/Tsscg" of the PWM cycle "Tpwm" to the SSCG cycle "Tsscg" becomes any of 1.5, 2.5, 3.5, etc. (Tpwm/Tsscg=1.5, 2.5, 3.5, etc.).

As shown in FIG. 2, the varying frequency "Fmod" of the duty value of the PWM signal becomes relatively high when the ratio "Tpwm/Tsscg" is any of 1.5, 2.5, 3.5, etc. (Tpwm/Tsscg=1.5, 2.5, 3.5, etc.), in addition to the case when the ratio "Tpwm/Tsscg" of the PWM cycle "Tpwm" to the SSCG cycle "Tsscg" is larger than 0.1 and smaller than 0.6 (0.1<Tpwm/Tsscg<0.6). As described above, the varying frequency "Fmod" of the duty value of the PWM signal is relatively high, the components of the varying frequency "Fmod" can be separated from the voice signal by the LPF 22. Thus, where the ratio "Tpwm/Tsscg" cannot be set to be larger than 0.1 and smaller than 0.6, the CPU 14 sets the SSCG cycle "Tsscg" and the PWM cycle "Tpwm" such that the ratio "Tpwm/Tsscg" ("Fsscg/Fpwm") becomes any of 1.5, 2.5, 3.5, etc. Further, the CPU 14 can set the SSCG cycle "Tsscg" and the PWM cycle "Tpwm" such that the ratio "Tpwm/Tsscg" becomes any of approximately 1.5, approximately 2.5, approximately 3.5, etc., in addition to the case where the ratio "Tpwm/Tsscg" becomes any of 1.5, 2.5, 3.5, etc. Further, the CPU 14 can set the SSCG cycle "Tsscg" and the PWM cycle "Tpwm" such that the ratio "Tpwm/Tsscg" falls within a range of approximately 1.4 to approximately 1.6. Further, the CPU 14 can set the SSCG cycle "Tsscg" and the PWM cycle "Tpwm" such that the ratio "Tpwm/Tsscg" falls within a range of approximately 1.25 to approximately 1.75. There will be explained a case where the SSCG frequency "Fsscg" is set at 44 kHz, that is, the SSCG cycle "Tsscg" is set at $\frac{1}{44}$ ms, as an example.

Figure 4:
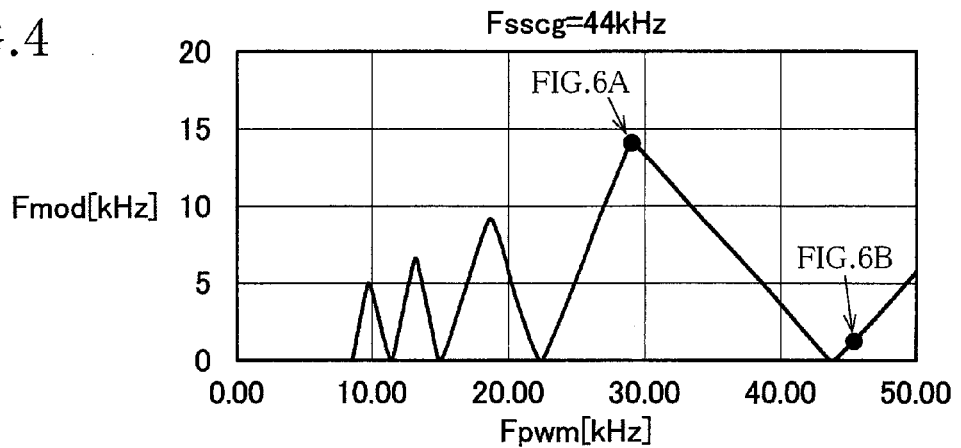
FIG. 4 is a view showing the relationship between the PWM frequency and the varying frequency of the PWM signal in the case where the Fsscg is 44 kHz.

FIG. 4 is a view showing a relationship between the PWM frequency "Fpwm" and the varying frequency "Fmod" of the duty value of the PWM signal in the case where the SSCG frequency "Fsscg" is set at 44 kHz.

As described above, the CPU 14 sets the SSCG cycle "Tsscg" and the PWM cycle "Tpwm" such that the ratio "Tpwm/Tsscg" of the PWM cycle "Tpwm" to the SSCG cycle "Tsscg" becomes any of 1.5, 2.5, 3.5, etc. (Tpwm/Tsscg=1.5, 2.5, 3.5, etc.). Since the "Tpwm/Tsscg" is equal to "Fsscg/Fpwm" (Tpwm/Tsscg=Fsscg/Fpwm), in the case where the SSCG frequency "Fsscg" is 44 kHz, "44/Fpwm" only needs to become any of 1.5, 2.5, 3.5, etc. Thus, the CPU 14 sets the PWM frequency "Fpwm" at 29.33 kHz (the PWM frequency "Fpwm"=29.33 kHz), that is, the CPU 14 sets the PWM cycle "Tpwm" at $\frac{1}{29.33}$ ms (the PWM cycle "Tpwm"=$\frac{1}{29.33}$ ms), for example. As thus described, the CPU 14 sets the PWM frequency "Fpwm" (the PWM cycle "Tpwm") after setting the SSCG frequency "Fsscg" (the SSCG cycle "Tsscg").

As shown in FIG. 4, when the PWM frequency "Fpwm" is 29.33 kHz, the varying frequency "Fmod" of the duty value of the PWM signal is approximately 14.55 kHz. As described above, since the voice signal used by, e.g., a telephone machine is up to approximately 3.4 kHz, where the varying frequency "Fmod" is approximately 14.55 kHz, the components of the varying frequency "Fmod" can be separated from the voice signal by the LPF 22. It is noted that, as in the embodiment in which the SSCG frequency "Fsscg" is set at 44 kHz, where the varying frequency "Fmod" is set at a value equal to or higher than 10 kHz, the varying frequency "Fmod" is preferably set at a value one third of the SSCG frequency "Fsscg". This is because the ratio "Tpwm/Tsscg" can be set at 1.5 (Tpwm/Tsscg=1.5) by setting the varying frequency "Fmod" at the value one third of the SSCG frequency "Fsscg", and the varying frequency "Fmod" can be set at the highest frequency where the ratio "Tpwm/Tsscg" is not larger than 0.1 or smaller than 0.6.

Further, the SSCG frequency "Fsscg" is preferably higher than the PWM frequency "Fpwm". This is because there is a demand to increase a speed (a frequency) of the SSCG frequency "Fsscg", and the SSCG frequency "Fsscg" needs to be set on a higher priority at a frequency higher than the PWM frequency "Fpwm".

Further, when the SSCG frequency "Fsscg" is set at the frequency higher than the PWM frequency "Fpwm", it is preferable that the SSCG frequency "Fsscg" is set before the PWM frequency "Fpwm", and then the PWM frequency "Fpwm" is set. The PWM frequency "Fpwm" in which the varying frequency "Fmod" of the duty value of the PWM signal is equal to or higher than the frequency of the voice signal can be set by selecting an appropriate value from a plurality of values even after the SSCG frequency "Fsscg" is set.

Here, there will be explained, with reference to FIGS. 6A and 6B, the voice signal outputted by the LPF 22 of the communication apparatus as the present embodiment. FIGS. 6A and 6B are views showing, by comparing, the voice outputting signal by the PWM signal of the communication apparatus as the present embodiment and the voice outputting signal by the PWM signal in which the varying frequency of the PWM signal is close to the frequency of the voice signal. It is noted that areas in which pulses are generated are hatched in FIGS. 6A and 6B for easy understanding purpose. FIG. 6A shows a voice outputting signal in a case where the varying frequency "Fmod" of the PWM circuit 13 in the present embodiment is 14.55 kHz (Fsscg=44 kHz, Fpwm=29.33 kHz) while FIG. 6B shows, as a comparative example, a voice outputting signal in a case where the varying frequency "Fmod" of the PWM circuit 13 in the present embodiment is 1.818 kHz (Fsscg=44 kHz, Fpwm=46.18 kHz). It is noted that each of leftmost graphs in FIGS. 6A and 6B shows the voice signal outputted by the modem 3, each of center graphs in FIGS. 6A and 6B shows the signal outputted from the analog switch 21, and each of rightmost graphs in FIGS. 6A and 6B shows the signal outputted from the LPF 22.

As shown in the graphs in FIG. 6A, in the case of the present embodiment, that is, in the case where the varying frequency "Fmod" is 14.55 kHz, since the duty of the PWM signal is changed at a frequency higher than the frequency of the voice signal, even where a width of the pulse of the PWM signal is changed, an affect caused by this change is removed by the LPF 22, and consequently the change of the sound volume by the variation of the PWM signal is less caused. On the other hand, as shown in the graphs in FIG. 6B, in the case of the comparative example, that is, in the case where the varying frequency "Fmod" is 1.818 kHz, since the duty of the PWM signal is changed at a frequency similar to the frequency of the voice signal, where a width of a pulse signal of the PWM signal is changed, it becomes difficult for the LPF 22 to remove an affect caused by this change, and consequently the change of the sound volume by the variation of the PWM signal is unfortunately caused. As shown in FIG. 6B, in a signal waveform of the signal output of the LPF 22 in the comparative example, (a) parts in which a degree of lowering of the voice signal is relatively large with respect to the sound output of the modem 3 and (b) parts in which the degree of lowering of the voice signal is relatively small with respect to the sound output of the modem 3 are periodically repeated. Thus, according to the present embodiment, the components of the varying frequency "Fmod" can be separated from the voice signal by the LPF 22, thereby preventing the generation of the unpleasant sound.

As explained above in detail, according to the embodiment of the present invention, the CPU 14 sets the SSCG cycle "Tsscg" and the PWM cycle "Tpwm" such that the ratio "Tpwm/Tsscg" of the PWM cycle "Tpwm" to the SSCG cycle "Tsscg" becomes any of 1.5, 2.5, 3.5, etc., for example. Thus, the PWM circuit 13 outputs the PWM signal in the PWM cycle "Tpwm" in which a half cycle of the SSCG cycle "Tsscg" is added to an integral multiple of the SSCG cycle "Tsscg", in other words, the half cycle is added to a value obtained by multiplying the SSCG cycle "Tsscg" by an integral value. As a result, the communication apparatus can support the increasing speed of the SSCG 12, and the components of the varying frequency "Fmod" of the duty value of the PWM signal can be separated from the voice signal by the LPF 22. Thus, the volume adjustment of the voice signal can be performed on the basis of the PWM signal without making the unpleasant sound. The affect caused by the variation of the PWM signal can be reduced, and a voice quality of the phone can be sufficiently maintained.

Further, the CPU 14 can set the SSCG cycle "Tsscg" and the PWM cycle "Tpwm" such that the ratio "Tpwm/Tsscg" becomes any of approximately 1.5, approximately 2.5, approximately 3.5, etc., or such that the ratio "Tpwm/Tsscg" falls within the range of approximately 1.4 to approximately 1.6, or such that the ratio "Tpwm/Tsscg" falls within the range of approximately 1.25 to approximately 1.75. Where the SSCG cycle "Tsscg" and the PWM cycle "Tpwm" are thus set, the volume adjustment of the voice signal can be performed on the basis of the PWM signal without making the unpleasant sound. Further, the varying frequency "Fmod" can be set at the value equal to or higher than approximately 4 kHz, or the value equal to or higher than approximately 10 kHz, or the value equal to or higher than approximately 10 kHz and approximately one third of the SSCG frequency "Fsscg". Where the varying frequency "Fmod" is thus set, the volume adjustment of the voice signal can be performed on the basis of the PWM signal without making the unpleasant sound.

It is to be understood that the invention is not limited to the details of the illustrated embodiment, but may be embodied with various changes and modifications, which may occur to those skilled in the art, without departing from the spirit and scope of the invention. For example, in the above-described embodiment, there has been explained the effect for reducing the unpleasant sound caused by the variation of the PWM signal in the voice signal from the telephone line 2, but the present invention is not limited to this. It should be understood that the same effect can be obtained in a voice signal such as a ring tone and a playback sound of a message recorded in a phone-answering machine.

Further, the present invention is not limited to the voice, but may be applied to an analog signal such as light. For example, where the CPU 14 controls the brightness of a lighting equipment on the basis of the PWM signal, flicker of the lighting equipment can be restrained by setting a variation of the brightness using the present invention at a frequency humans cannot recognize.

Further, the analog switch 21 is switched between the voice signal and the reference potential Vref, but the present invention is not limited to this. The analog switch 21 only needs to be configured to be switched between a pass and an interrupt of the voice signal.

Further, the setting of the SSCG cycle "Tsscg" and the PWM cycle "Tpwm" by the CPU 14 may be performed based on a value of any of the cycle and the frequency.

What is claimed is:

1. A communication apparatus comprising:
   a modulator configured to modulate a reference clock signal having a predetermined basic frequency and output a modulated clock signal whose value fluctuates at a first frequency with respect to the basic frequency;
   a PWM signal generator configured to generate a PWM signal at a second frequency, with the modulated clock signal being an operation clock;
   a switching portion configured to output a signal by switching an analog signal on the basis of the PWM signal;
   a filter configured to pass a signal included in an output signal of the switching portion, a frequency of the passed signal being lower than a third frequency, and
   a setting portion configured to set the first frequency and the second frequency such that a fourth frequency as a frequency in which a duty value of the PWM signal generated by the PWM signal generator fluctuates is higher than the third frequency and such that the first frequency is higher than the second frequency.

2. The communication apparatus according to claim 1, wherein the setting portion is configured to set the first frequency and the second frequency such that the fourth frequency is equal to or higher than approximately 4 kHz, where the analog signal is a voice signal.

3. The communication apparatus according to claim 2, wherein the fourth frequency is equal to or higher than approximately 10 kHz.

4. The communication apparatus according to claim 2, wherein the fourth frequency is equal to or higher than approximately 10 kHz and is approximately one third of the first frequency.

5. The communication apparatus according to claim 1, wherein a ratio of the first frequency to the second frequency ranges from approximately 1.25 to approximately 1.75.

6. The communication apparatus according to claim 5, wherein the ratio of the first frequency to the second frequency ranges from approximately 1.4 to approximately 1.6.

7. The communication apparatus according to claim 6, wherein the ratio of the first frequency to the second frequency is approximately 1.5, and
   wherein the first frequency is approximately 44 kHz while the second frequency is approximately 29.33 kHz.

8. The communication apparatus according to claim 1, wherein a ratio of the first frequency to the second frequency is one of approximately 1.5, approximately 2.5, and approximately 3.5.

9. The communication apparatus according to claim 1, wherein the setting portion is configured to set the second frequency after setting the first frequency.

10. The communication apparatus according to claim 1, wherein the switching portion is connected between a modem and a speaker and is configured to perform a volume adjustment of a voice signal inputted from a telephone line, and
    wherein the filter is connected between the switching portion and the speaker and is configured to pass a voice signal included in the output signal of the switching portion.

11. The communication apparatus according to claim 1, wherein the setting portion is configured to set a duty of the PWM signal.

12. The communication apparatus according to claim 1, wherein the modulator is a spread spectrum clock generator.

13. A signal processing method comprising:
    modulating a reference clock signal having a predetermined basic frequency and outputting a modulated clock signal whose value fluctuates at a first frequency with respect to the basic frequency;
    generating a PWM signal at a second frequency, with the modulated clock signal being an operation clock;
    outputting a signal by switching an analog signal on the basis of the PWM signal;
    passing a signal whose frequency is lower than a third frequency component included in the outputted signal; and
    setting the first frequency and the second frequency such that a fourth frequency as a varying frequency of the generated PWM signal is higher than the third frequency and such that the first frequency is higher than the second frequency.

* * * * *